United States Patent
Inoue et al.

(10) Patent No.: US 10,343,919 B2
(45) Date of Patent: Jul. 9, 2019

(54) PRODUCTION METHOD FOR CARBON NANOTUBES

(71) Applicants: NATIONAL UNIVERSITY CORPORATION SHIZUOKA UNIVERSITY, Shizuoka (JP); JNC CORPORATION, Tokyo (JP)

(72) Inventors: Yoku Inoue, Shizuoka (JP); Takayuki Nakano, Shizuoka (JP); Tauto Nakanishi, Chiba (JP)

(73) Assignees: NATIONAL UNIVERSITY CORPORATION SHIZUOKA UNIVERSITY, Shizuoka (JP); JNC CORPORATION, Tokyo (JP)

( * ) Notice: Subject to any disclaimer, the term of this patent is extended or adjusted under 35 U.S.C. 154(b) by 0 days.

(21) Appl. No.: 15/841,306

(22) Filed: Dec. 14, 2017

(65) Prior Publication Data

US 2018/0105423 A1 Apr. 19, 2018

Related U.S. Application Data

(62) Division of application No. 14/914,628, filed as application No. PCT/JP2014/072652 on Aug. 28, 2014, now abandoned.

(30) Foreign Application Priority Data

Aug. 28, 2013 (JP) ................................. 2013-177235

(51) Int. Cl.
*C23C 16/448* (2006.01)
*C01B 32/158* (2017.01)
*C23C 16/26* (2006.01)
*C01B 32/162* (2017.01)

(52) U.S. Cl.
CPC .......... *C01B 32/158* (2017.08); *C01B 32/162* (2017.08); *C23C 16/26* (2013.01); *C23C 16/448* (2013.01)

(58) Field of Classification Search
CPC .................................................... C01B 32/16
See application file for complete search history.

(56) References Cited

U.S. PATENT DOCUMENTS

| | | | | |
|---|---|---|---|---|
| 2006/0251568 A1* | 11/2006 | Fahlman | ................ | B82Y 30/00 423/447.3 |
| 2008/0176069 A1* | 7/2008 | Ma | ........................ | B82Y 30/00 428/367 |
| 2010/0247421 A1* | 9/2010 | Noda | ..................... | B01J 23/745 423/447.3 |
| 2011/0008240 A1* | 1/2011 | Inoue | ..................... | B82Y 30/00 423/447.7 |

* cited by examiner

*Primary Examiner* — Joseph A Miller, Jr.
(74) *Attorney, Agent, or Firm* — JCIPRNET

(57) ABSTRACT

The invention shows a production method for carbon nanotubes. The production method comprises a first step of feeding at least one kind of gas-phase catalyst into a first chamber, the at least one kind of gas-phase catalyst being formed from an iron family element-containing substance and a halogen-containing substance that are contained in a first liquid; and a second step of forming the carbon nanotubes from a carbon source fed into the first chamber using a catalyst generated based on the gas-phase catalyst existing in the first chamber, wherein the first step includes vaporization of the first liquid, and the first liquid does not contain the carbon source.

8 Claims, 5 Drawing Sheets

PRODUCTION METHOD FOR CARBON NANOTUBES

CROSS-REFERENCE TO RELATED APPLICATION

This application is a divisional application of and claims the priority benefit of U.S. patent application Ser. No. 14/914,628, filed on Feb. 25, 2016, now pending. The prior U.S. patent application Ser. No. 14/914,628 is a 371 application of the international PCT application serial no. PCT/JP2014/072652, filed on Aug. 28, 2014, which claims the priority benefit of Japan application no. 2013-177235, filed on Aug. 28, 2013. The entirety of each of the above-mentioned patent applications is hereby incorporated by reference herein and made a part of this specification.

TECHNICAL FIELD

The present invention relates to a production method for carbon nanotubes.

As used herein, the "carbon nanotube array" (also referred to as a "CNT array" herein) is a kind of a synthetic structure of a plurality of carbon nanotubes (also referred to as "CNT" herein) (hereinafter, the individual shape of CNT giving such a synthetic structure will be referred to as a "primary structure" while the above synthetic structure may also be referred to as a "secondary structure"), and means an aggregate of CNT in which a plurality of CNT grow so as to be oriented in a predetermined direction (specific one example may be a direction substantially parallel to one normal line of a plane of a substrate) with regard to at least part of a major axis direction. The "growth height" as used herein refers to a length (height) of a CNT array grown from a substrate in the direction parallel to the normal line of the substrate in a state in which the CNT array is attached on the substrate.

In the present description, a structure having a configuration in which a plurality of CNT are entangled to each other will be referred to as a "CNT entangled body," in which the structure is formed by continuously drawing the plurality of CNT from the CNT array by taking part of CNT of the CNT array to pull the CNT so as to be separated from the CNT array (work therefor herein will be also referred to as "spinning" after work for producing threads from fibers as related to a conventional art).

BACKGROUND ART

CNT have a specific configuration of having an outside surface formed of graphene, and therefore application in various fields is expected as a functional material and also as a structural material. Specifically, CNT have excellent characteristics, such as high mechanical strength, light weight, satisfactory electrical conduction characteristics, satisfactory heat characteristics such as heat resistance and heat conductivity, high resistance to chemical corrosion, and satisfactory field emission characteristics. Accordingly, the use of CNT conceivably includes a lightweight and high strength wire, a probe of a scanning probe microscope (SPM), a cold cathode of a field emission display (FED), an electrically conductive resin, a high strength resin, a corrosion-resistant resin, a wear-resistant resin, a highly lubricating resin, electrodes of a secondary battery and fuel cell, an interlayer wiring material for LSI, and a biosensor.

As one of production methods for CNT, Patent Literature No. 1 discloses a method comprising: preliminarily forming a solid-phase metal catalyst layer on a surface of a substrate by means of sputtering and the like, such as by vapor-depositing a thin film of a metallic material; disposing the substrate provided with the solid-phase metal catalyst layer in a reactor; forming catalyst particles from the metal catalyst layer to be growth nuclei on the substrate; and feeding a hydrocarbon gas into the reactor to form a CNT array on the substrate. Hereinafter, the method comprising: forming the solid-phase catalyst particles as the growth nuclei on the substrate as described above; and feeding a hydrocarbon-based material into the reactor, in which the substrate provided with the solid-phase catalyst particles is disposed, to produce a CNT array will be referred to as a solid-phase catalysis process.

As a method for highly efficiently producing a CNT array by the solid-phase catalysis process, Patent Literature No. 2 discloses a method of feeding a material gas that contains carbon and no oxygen, a catalyst activator that contains oxygen, and an atmospheric gas, while meeting predetermined conditions so that they are brought into contact with a solid-phase catalyst layer.

Another method is also disclosed which produces a CNT array in a different manner from that of the method described above. More specifically, Patent Literature No. 3 discloses a method comprising: sublimating iron chloride; using the sublimated iron chloride as a precursor to form a catalyst to be growth nuclei on a substrate; and using the catalyst to form a CNT array. This method is substantially different from the arts as disclosed in Patent Literature Nos. 1 and 2 in that a halogen-containing substance in gas-phase is used as a catalyst precursor and this substance is used to form a catalyst. In the present description, the production method for a CNT array as disclosed in Patent Literature No. 3 will also be referred to as a gas-phase catalysis process.

CITATION LIST

Patent Literature

Patent Literature No. 1: JP 2004-107196 A
Patent Literature No. 2: JP 4803687 B
Patent Literature No. 3: JP 2009-196873 A

DISCLOSURE OF INVENTION

Technical Problem

In the production method for a CNT array by such a gas-phase catalysis process, the action of the catalyst may be different, as caused by difference in the forming process of the catalyst, from the production method for a CNT array by the above solid-phase catalysis process. Therefore, the solid-phase catalysis process and the gas-phase catalysis process are considered to be substantially different production methods for a CNT array. Accordingly, when producing CNT having various primary structures and secondary structures by the gas-phase catalysis process, a variety of approaches can be provided to improve the productivity based on the production method being the gas-phase catalysis process.

The present invention provides a means capable of improving the production controllability of CNT to be produced by the above gas-phase catalysis process.

Solution to Problem

The present invention is as described below.

(1) A production method for carbon nanotubes, comprising: a first step of feeding at least one kind of gas-phase catalyst into a first chamber, the at least one kind of gas-phase catalyst being formed from an iron family element-containing substance and a halogen-containing substance that are contained in a first liquid; and a second step of forming the carbon nanotubes from a carbon source fed into the first chamber using a catalyst generated based on the gas-phase catalyst existing in the first chamber, wherein the first step includes vaporization of the first liquid, and the first liquid does not contain the carbon source.

(2) The production method according to the above (1), wherein: the first step includes allowing a substrate disposed in the first chamber to exist in an atmosphere including the gas-phase catalyst; and the second step includes forming the carbon nanotubes in an array-like form on a base surface of the substrate.

(3) The production method according to the above (2), wherein the carbon source is fed into the first chamber in a state in which the gas-phase catalyst exists in the first chamber via the first step.

(4) The production method according to any one of the above (1) to (3), wherein a temperature of the substrate in the first step is lower than a temperature of the substrate in the second step.

(5) The production method according to the above (1), wherein the carbon nanotubes are formed as a generated substance by a gas-phase flow reaction.

(6) The production method according to any one of the above (1) to (5), wherein an iron family element contained in the iron family element-containing substance includes iron.

(7) The production method according to any one of the above (1) to (6), wherein the vaporization of the first liquid is performed outside the first chamber, and a vapor of the first liquid is fed into the first chamber from outside of the first chamber.

(8) The production method according to any one of the above (1) to (7), wherein the iron family element-containing substance contained in the first liquid includes an iron-methanol complex.

Advantageous Effects of Invention

According to the production method for CNT of the present invention, it becomes easy to feed the gas-phase catalyst into the first chamber. Therefore, when the CNT are produced by the gas-phase catalysis process, it is expected to make easy to control the generation amount and the structural properties (both the primary and secondary structures) of the CNT.

DETAILED DESCRIPTION OF THE PREFERRED EMBODIMENTS

Embodiments of the present invention will be described below.

1. Production Apparatus for CNT Array

A production apparatus for a CNT array according to a first embodiment of the present invention will be described with reference to the drawings.

Figure 1:
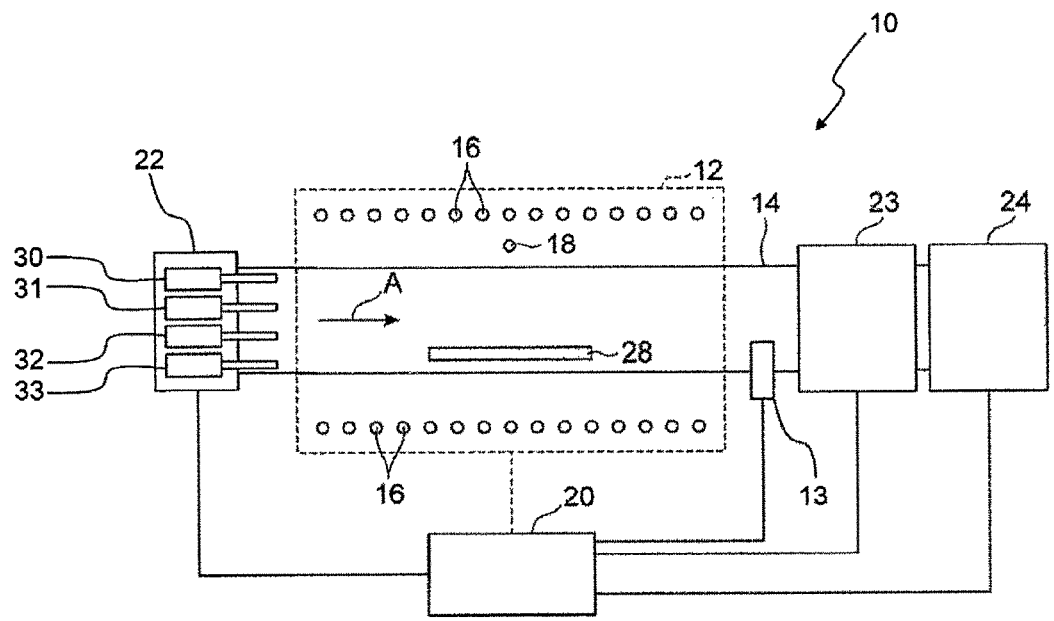
FIG. 1 is a drawing schematically showing a configuration of a production apparatus for a CNT array according to a first embodiment of the present invention.

FIG. 1 is a drawing schematically showing a configuration of a production apparatus used for a production method for a CNT array according to the first embodiment of the present invention.

As shown in FIG. 1, production apparatus 10 for a CNT array is provided with electric furnace 12. Electric furnace 12 takes on a substantially cylindrical shape that extends along predetermined direction A (direction in which a material gas flows). Inside electric furnace 12, reaction vessel pipe 14 as a first chamber having a growth region that is a region in which CNT are formed is passed through. Reaction vessel pipe 14 is a substantially cylindrically-shaped member formed of a heat-resistant material such as quartz, has an outside diameter smaller than an outside diameter of electric furnace 12, and extends along predetermined direction A. In FIG. 1, substrate 28 provided with a base surface that is a surface on which a CNT array grows is disposed in the growth region of reaction vessel pipe 14. That is, the growth region in production apparatus 10 for a CNT array includes a region in which substrate 28 in reaction vessel pipe 14 is disposed.

Electric furnace 12 is provided with heater 16 and thermocouple 18. In production apparatus 10 for a CNT array, heater 16 and thermocouple 18 constitute a first temperature adjustment device. Heater 16 is disposed so as to surround a predetermined region (in other words, a predetermined region of substantially cylindrically-shaped reaction vessel pipe 14 in an axial direction, and hereinafter, also referred to as a "heating region") in predetermined direction A of reaction vessel pipe 14 to generate heat for raising a temperature of an atmosphere in the pipe in the heating region of reaction vessel pipe 14. Thermocouple 18 is disposed in the vicinity of the heating region of reaction vessel pipe 14 inside electric furnace 12 to allow output of an electrical signal that represents a temperature associated with a temperature of the atmosphere in the pipe in the heating region of reaction vessel pipe 14. Heater 16 and thermocouple 18 are electrically connected to control device 20.

To the upstream side (in FIG. 1, to one end at the left side) of reaction vessel pipe 14 in predetermined direction A, feed device 22 is connected. Feed device 22 is provided with raw material gas feed device 30, first gas-phase material feed device 31, gas-phase co-catalyst feed device 32, and auxiliary gas feed device 33. Feed device 22 is electrically connected to control device 20, and also electrically connected to each feed device of feed device 22.

Raw material gas feed device 30 (first feed device) can feed, into the inside of reaction vessel pipe 14 (in particular, to the growth region), a carbon compound (for example, hydrocarbon such as acetylene) that serves as a raw material of CNT constituting the CNT array, i.e. a raw material gas that contains a carbon source. A flow rate of feeding the raw material gas from raw material gas feed device 30 can be regulated using a publicly known flow rate regulating instrument such as mass flow.

First gas-phase material feed device 31 can feed first gas-phase material G, which is obtained by vaporization of first liquid L accommodated in first gas-phase material feed device 31, into the inside of reaction vessel pipe 14. As used herein, the "vaporization" means both of causing a substance contained in first liquid L to be in a gas-phase state and forming an aerosol of first liquid L. First gas-phase material G contains a gas-phase catalyst originated from first liquid L or a precursor of the gas-phase catalyst, and therefore first gas-phase material feed device 31 can feed the gas-phase catalyst into the inside of reaction vessel pipe 14 (in particular, to the growth region). As used herein, the "gas-phase catalyst" means a collective term of a substance that is a halogen-containing catalyst precursor and that can be in a gas-phase state in the growth region of the reaction vessel pipe 14 and a suspended substance that is formed based on the halogen-containing catalyst precursor. At least part of substances that constitute the gas-phase catalyst attaches on the base surface of substrate 28, and at least part of catalysts that contribute to formation of CNT, in the present embodiment formation of a CNT array, is formed based on the attached substances.

Figure 2:
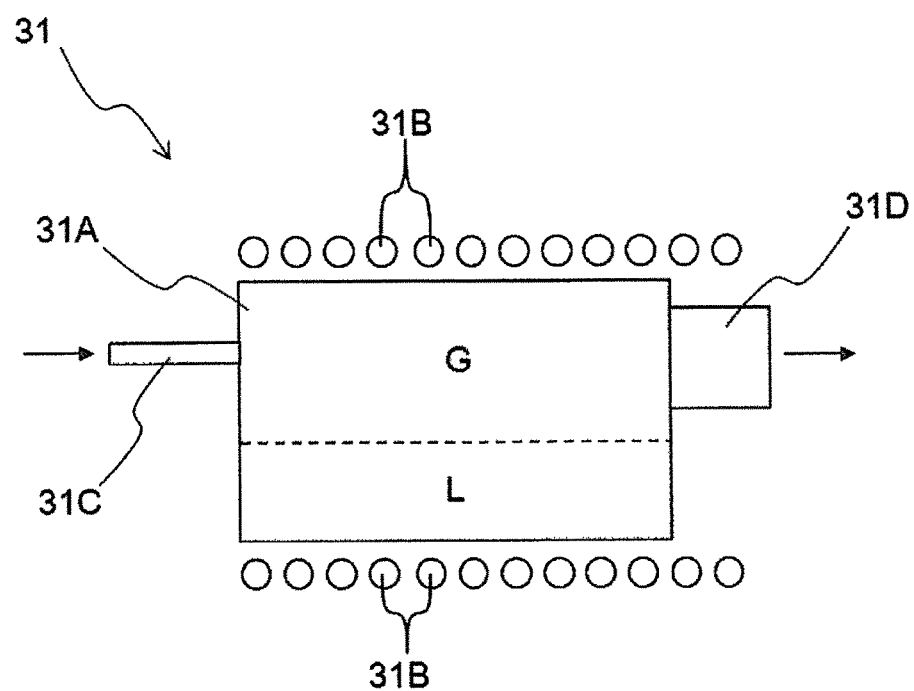
FIG. 2 is a drawing schematically showing a configuration of a gas-phase catalyst feed device of the production apparatus shown in FIG. 1.

As shown in FIG. 2, first gas-phase material feed device 31 has a unit structure as will be described below. That is, first gas-phase material feed device 31 is provided with feed unit chamber 31A that can accommodate first liquid L composed of at least one kind of a liquid that contains a gas-phase catalyst and a liquid that contains a precursor of the gas-phase catalyst and a feed unit temperature adjustment device that can adjust the temperature of first liquid L in feed unit chamber 31A. In FIG. 2, the feed unit temperature adjustment device is composed of heater 31B (part of the first vaporization device) and a temperature measurement device such as a thermocouple not shown.

First gas-phase material feed device 31 is provided with first liquid feed device 31C that can feed first liquid L into feed unit chamber 31A. First liquid L is adjusted to a predetermined temperature by the feed unit temperature adjustment device (including heater 31B and the like) in feed unit chamber 31A thereby to be vaporized. Thus, in first gas-phase material feed device 31, the feed unit temperature adjustment device represents a feed unit vaporization device that can form first gas-phase material G by vaporizing first liquid L. First gas-phase material feed device 31 is provided with discharge device 31D that can discharge first gas-phase material G in feed unit chamber 31A outside the feed unit chamber 31A. In FIG. 1, the destination of first gas-phase material G is inside of reaction vessel pipe 14, and first gas-phase material G is fed into reaction vessel pipe 14 from first gas-phase material feed device 31. First liquid feed device 31C and discharge device 31D may be provided with means for adjusting the amount of a substance that passes therethrough.

When first gas-phase material G contains a gas-phase catalyst originated from first liquid L, the gas-phase catalyst is fed to the growth region in reaction vessel pipe 14. On the other hand, when first gas-phase material G contains a precursor of the gas-phase catalyst originated from first liquid L, the gas-phase catalyst is formed from the precursor of the gas-phase catalyst, and the formed gas-phase catalyst is fed to the growth region in reaction vessel pipe 14.

In first gas-phase material feed device 31 shown in FIG. 1, the feed unit temperature adjustment device represents a feed unit vaporization device, and the feed unit temperature adjustment device vaporizes first liquid L to generate the first gas-phase material, but the present invention is not limited thereto. For example, the feed unit vaporization device may be provided with a mechanism that regulates the pressure in feed unit chamber 31A, and the pressure in feed unit chamber 31A may be reduced to vaporize first liquid L, or the feed unit vaporization device may be provided with a mechanism that feeds a gas into first liquid L in feed unit chamber 31A, and an inert gas or hydrogen may be fed into (bubbled in) first liquid L to vaporize first liquid L. In an alternative embodiment, the feed unit vaporization device may be provided with a mechanism that increases the pressure of first liquid L in feed unit chamber 31A and fine pores that can spray first liquid L outside feed unit chamber 31A, and first liquid L may be sprayed from the fine pores to vaporize.

First gas-phase material feed device 31 may have an exhaust system (pressure adjustment device) that can regulate the pressure in feed unit chamber 31A, and may also have a gas feed system (gas feed device) that allows a gas to be fed into feed unit chamber 31A. Having such an exhaust system and/or gas feed system may make it easy to vaporize first liquid L.

Gas-phase co-catalyst feed device 32 can feed a gas-phase co-catalyst into reaction vessel pipe 14 (in particular, to the growth region). The gas-phase co-catalyst will be described later. The flow rate of feeding the gas-phase co-catalyst from gas-phase co-catalyst feed device 32 can be regulated using the publicly known flow rate regulating instrument such as the mass flow.

Auxiliary gas feed device 33 allows feed of a gas other than the above raw material gas, first gas-phase material and gas-phase co-catalyst, for example, an inert gas such as argon (such a gas herein is generically referred to as an "auxiliary gas") into reaction vessel pipe 14 (in particular, to the growth region). The flow rate of feeding the auxiliary gas from auxiliary gas feed device 33 can be regulated using the publicly known flow rate regulating instrument such as the mass flow.

To the other end at the downstream side (right side in FIG. 1) of reaction vessel pipe 14 in predetermined direction A, pressure regulating valve 23 (part of the pressure adjustment device) and exhaust device 24 (also part of the pressure adjustment device) are connected. Pressure regulating valve 23 allows regulation of the pressure in reaction vessel pipe 14 by varying a degree of opening and closing of the valve. Exhaust device 24 performs vacuum exhaust of the inside of reaction vessel pipe 14. Specific types of exhaust device 24 are not particularly limited, and a rotary pump, oil diffusion pump, mechanical booster, turbomolecular pump, cryopump or the like can be used alone or in combination therewith. Pressure regulating valve 23 and exhaust device 24 are electrically connected to control device 20. In addition, reaction vessel pipe 14 is provided therein with pressure gauge 13 for measuring the internal pressure thereof. Pressure gauge 13 is electrically connected to control device 20 to allow output of an electrical signal that represents the internal pressure of reaction vessel pipe 14 to control device 20.

As described above, control device 20 is electrically connected to heater 16, thermocouple 18, feed device 22, pressure gauge 13, pressure regulating valve 23 and exhaust device 24 to be input with the electrical signals output from the devices or the like, and based on the input electrical signals, to control operation of the devices or the like. Examples of specific operation of control device 20 will be presented below.

Control device 20 allows input of the electrical signal output from thermocouple 18 and related to the internal temperature of reaction vessel pipe 14, and to heater 16, allows output of a control signal related to operation of heater 16 as determined based on the electrical signal. Heater 16 to which the control signal from the control device is input allows operation for increasing or decreasing an amount of produced heat to vary the internal temperature in the heating region of reaction vessel pipe 14, based on the control signal.

Control device 20 allows input of an electrical signal output from pressure gauge 13 and related to the internal pressure in the heating region of reaction vessel pipe 14, and to pressure regulating valve 23 and exhaust device 24, allows output of a control signal as related to operation of pressure regulating valve 23 and exhaust device 24 as determined based on the electrical signal. Pressure regulating valve 23 and exhaust device 24 to which the control signal from control device 20 is input allow operation of varying a degree of opening of pressure regulating valve 23, and/or varying the exhausting capability of exhaust device 24, and the like, based on the control signal.

According to a preset timetable, control device 20 allows, to each device, output of a control signal for controlling operation of each device or the like. For example, control device 20 allows, to feed device 22, output of a control signal for determining start and stop of feeding a substance from each of raw material gas feed device 30, first gas-phase material feed device 31, gas-phase co-catalyst feed device 32 and auxiliary gas feed device 33 of gas feed device 22, and the flow rate of feed thereof. Gas feed device 22 to which the control signal is input, according to the control signal, allows operation of each feed device to start or stop feed of each substance such as the raw material gas into reaction vessel pipe 14.

Control device 20 can control operation of each part that constitutes first gas-phase material feed device 31. More specifically, based on the electrical signal from the temperature measurement device such as a thermocouple of first gas-phase material feed device 31, control device 20 can output a control signal as related to operation of heater 31B. Heater 31B, to which the control signal is input, varies the temperature of first liquid L in feed unit chamber 31A in accordance with the control signal. This variation of temperature can adjust the generation amount of first gas-phase material G. Control device 20 can output a control signal as related to operation of first liquid feed device 31C. First liquid feed device 31C, to which the control signal is input, varies the feed amount of first liquid L into feed unit chamber 31A in accordance with the control signal. Control device 20 can output a control signal as related to operation of discharge device 31D. Discharge device 31D, to which the control signal is input, can adjust the timing and amount of discharging first gas-phase material G outside feed unit chamber 31A, i.e. feeding first gas-phase material G into reaction vessel pipe 14 in FIG. 1, in accordance with the control signal. When first gas-phase material feed device 31 is provided with additional exhaust system and/or gas feed system as described above, control device 20 can output control signals as related to operations thereof.

Figure 3:
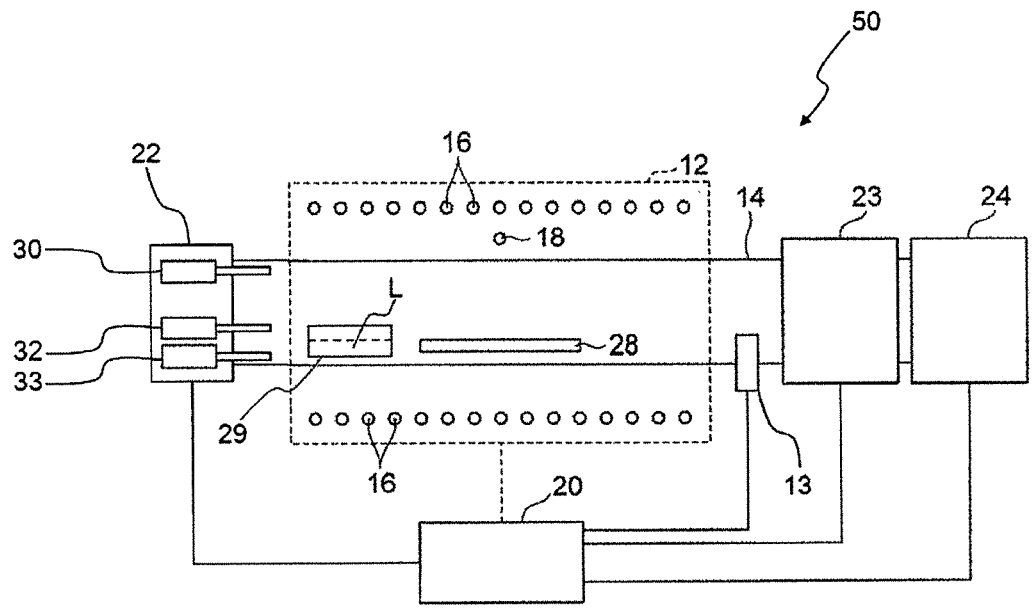
FIG. 3 is a drawing schematically showing a configuration of an example of a production apparatus for a CNT array according to a second embodiment of the present invention.

A production apparatus for a CNT array according to a second embodiment of the present invention will be described with reference to the drawings. FIG. 3 is a drawing schematically showing a configuration of a production apparatus used for a production method for a CNT array according to the second embodiment of the present invention. As shown in FIG. 3, production apparatus 50 for a CNT array according to the second embodiment of the present invention has a common basic configuration with that of production apparatus 10 for a CNT array according to the first embodiment of the present invention as shown in FIG. 1 except that feed device 22 is provided with a heat-resistant tray 29 that is located in electric furnace 12 and can accommodate first liquid L therein, as substitute for first gas-phase material feed device 31 provided in feed device 22, and that first liquid L is accommodated in heat-resistant tray 29 in reaction vessel pipe 14.

In such a configuration of production apparatus 50 for a CNT array according to the second embodiment of the present invention, the vaporization of first liquid L is performed in reaction vessel pipe 14. A gas-phase catalyst contained in first gas-phase material G obtained by vaporization of first liquid L or a gas-phase catalyst formed from first gas-phase material G diffuses in reaction vessel pipe 14 to reach the growth region. In FIG. 3, heater 16 can adjust the temperature of substrate 28 disposed in reaction vessel pipe 14 and the temperature of first liquid L in heat-resistant tray 29. Thus, in production apparatus 50 for a CNT array according to the second embodiment, heater 16 and thermocouple 18 constitute a vaporization device for first liquid L.

Figure 4:
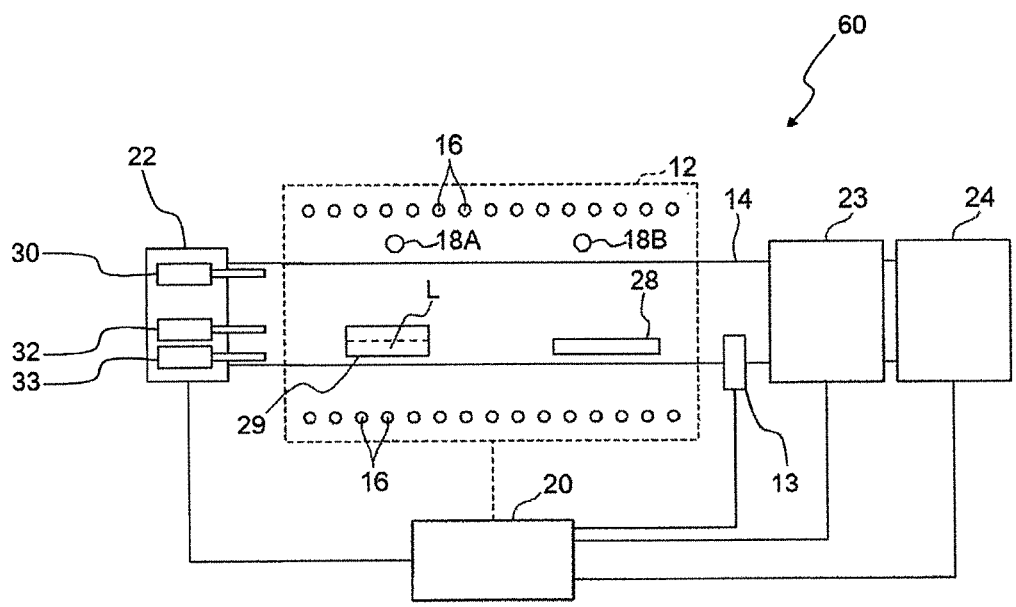
FIG. 4 is a drawing schematically showing a configuration of another example of a production apparatus for a CNT array according to the second embodiment of the present invention.

As in production apparatus 50 for a CNT array according to the second embodiment of the present invention, when the vaporization of first liquid L is performed in reaction vessel pipe 14, the atmosphere temperature in reaction vessel pipe 14 can be controlled in a divided manner in reaction vessel pipe 14. For example, production apparatus 60 for a CNT array shown in FIG. 4 is provided with a plurality of thermocouples 18A and 18B, and heater 16 can control the temperature in a divided manner in the axial direction of reaction vessel pipe 14 (upstream side and downstream side) based on the electrical signals from respective thermocouples.

Therefore, in the region at the upstream side (left side in FIG. 4) of reaction vessel pipe 14, the upstream side (left side in FIG. 4) of heater 16 can be operated based on the electrical signal from thermocouple 18A thereby to adjust the temperature of first liquid L in heat-resistant tray 29.

In the region at the downstream side (right side in FIG. 4) of reaction vessel pipe 14, the downstream side (right side in FIG. 4) of heater 16 can be operated based on the electrical signal from thermocouple 18B thereby to adjust the temperature of the growth region in which substrate 28 is disposed. According to such a structure, it is possible to generate first gas-phase material G at the upstream side of reaction vessel pipe 14 while adjusting the temperature of the reaction region at the downstream side of reaction vessel pipe 14.

A production apparatus for a CNT array according to an embodiment of the present invention may be provided with two or more structural features of the above production apparatuses 10, 50 and 60 for a CNT array. In an embodiment, a CNT apparatus may be provided with first gas-phase material feed device 31 so as to be capable of feeding first gas-phase material G into reaction vessel pipe 14 and may further be provided with heat-resistant tray 29 so that the vaporization of first liquid L disposed in reaction vessel pipe 14 can be carried out in reaction vessel pipe 14.

2. Production Method for CNT Array

A production method for a CNT array according to an embodiment of the present invention will be described. The production method for a CNT array according to the present embodiment includes a first step and a second step.

(1) First Step

The production method for a CNT array according to the present embodiment includes a first step that feeds at least one kind of gas-phase catalyst, which is formed from an iron family element-containing substance and a halogen-containing substance that are contained in first liquid L, into the first chamber. Here, the first step includes vaporization of first liquid L. This vaporization of first liquid L may be performed outside reaction vessel pipe 14 as in the case of using production apparatus 10 for a CNT array, or may also be performed inside reaction vessel pipe 14 as in the case of using production apparatus 50 or 60 for a CNT array. First gas-phase material G, which is a vapor of first liquid L, contains a gas-phase catalyst or a precursor of the gas-phase catalyst, and therefore, by performing the first step, substrate 28 disposed in reaction vessel pipe 14 is allowed to exist in an atmosphere that includes the gas-phase catalyst.

Here, in the production method for a CNT array according to the present embodiment, it is preferred that substrate 28 is provided with a base surface that is a surface formed of a material including an oxide of silicon, at least as part of the surface of substrate 28.

The specific constitution of substrate 28 is not limited. The shape thereof is arbitrary, and may be a simple shape such as a flat plate or a cylinder, or may have a three-dimensional shape in which complicated recesses and projections are provided. Moreover, the entire surface of the substrate may be the base surface, or may be in a so-called patterned state in which only part of the surface of the substrate is the base surface, and other parts are not.

The base surface is a surface formed of a material that contains an oxide of silicon, and the CNT array is formed on the base surface in the second step. Detail of the material constituting the base surface is not limited as long as the material contains an oxide of silicon. Specific one example of the material constituting the base surface may be quartz ($SiO_2$). Specific other examples of the material constituting the base surface include $SiO_x$ ($x \leq 2$) which can be obtained such as by sputtering silicon in an oxygen-containing atmosphere. Specific still another example may be silicon-containing composite oxide. Specific examples of an element other than silicon and oxygen that constitutes the composite oxide include Fe, Ni and Al. Specific still another example may be a compound in which a nonmetallic element such as nitrogen and boron is added to an oxide of silicon.

The material constituting the base surface may be identical with or different from a material constituting substrate 28. To present specific examples, specific examples include a case where the material constituting substrate 28 is formed of quartz and the material constituting the base surface is also formed of quartz, and a case where the material constituting substrate 28 is formed of a silicon substrate based essentially on silicon, and the material constituting the base surface is formed of an oxide film thereof.

As described above, the first step includes: feeding the gas-phase catalyst via first liquid L into reaction vessel pipe 14 using first gas-phase material feed device 31 in production apparatus 10 or using heat-resistant tray 29 in production apparatus 50 or 60; and allowing substrate 28 provided with the above base surface to exist in an atmosphere that includes the gas-phase catalyst. Any of production apparatuses 10, 50 and 60 for a CNT array can be used to feed various kinds of gas-phase catalysts into reaction vessel pipe 14 by appropriately selecting the kind of iron family element-containing substance and halogen-containing substance that are contained in first liquid L.

The iron family element-containing material contained in first liquid L is a substance that contains an iron family element (i.e. at least one kind of iron, cobalt, and nickel), and the specific composition thereof is not limited. Specific examples of the iron family element-containing material include a coordinate compound having an iron family element as at least one of central metal elements, such as an iron-methanol complex, and ions of an iron family element. The iron family element-containing substance may be constituted of one kind of material, or may also be constituted of plural kinds of materials. In view of easy availability, easy formation of CNT and the like, it is preferred that the iron family elements contained in the iron family element-containing substance include iron.

The halogen-containing substance contained in first liquid L is a substance that contains halogen (i.e. at least one kind of fluorine, chlorine, bromine, and iodine), and the specific composition thereof is not limited. Specific examples of the halogen-containing substance include fluoride ions ($F^-$), chloride ions ($Cl^-$), bromide ions ($Br^-$), and iodide ions ($I^-$). The halogen-containing substance may be constituted of one kind of substance, or may also be constituted of plural kinds of substances. The iron family element-containing substance and the halogen-containing substance may be in a state in which they interact with each other in first liquid L. One example of such a compound may be chloride of an iron-methanol complex.

Solvent contained in first liquid L is not limited. The solvent may be a protic polar solvent such as water and alcohol, an aprotic polar solvent such as acetone and acetonitrile, or an apolar solvent such as cyclohexane and toluene. The composition of the solvent may be appropriately set in accordance with properties of the iron family element-containing substance and halogen-containing substance which are contained in first liquid L.

The gas-phase catalyst according to the present embodiment includes a reaction product of the iron family element-containing substance and halogen-containing substance which are contained in first liquid L. Specific examples of the gas-phase catalyst include halide of an iron family element (also referred to as "iron family element halide" herein). Specific further examples of such iron family element halide include iron fluoride, cobalt fluoride, nickel fluoride, iron chloride, cobalt chloride, nickel chloride, iron bromide, cobalt bromide, nickel bromide, iron iodide, cobalt iodide, and nickel iodide. In the iron family element halide, different compounds may occasionally exist according to valence of ion of the iron family element, such as iron(II) chloride and iron(III) chloride. The gas-phase catalyst may be constituted of one kind of substance or plural kinds of substances.

The relationship between first liquid L and first gas-phase material G is not particularly limited. In a specific example of a case in which first liquid L is a methanol solution that contains the above chloride of an iron-methanol complex, when first liquid L is heated to volatilize methanol as the solvent, and as a result the generated solid-phase iron chloride sublimates, first gas-phase material G includes iron chloride which is one kind of the gas-phase catalyst. When the above first liquid L is vaporized such as by liquid mass flow, first gas-phase material G is aerosol of first liquid L. From the methanol complex in this aerosol of first liquid L, iron chloride is generated in a similar manner to the above case and sublimates to be one kind of the gas-phase catalyst. In this case, chloride of the iron-methanol complex in first liquid L is considered as a precursor of the gas-phase catalyst.

In addition to any of the above feed methods, another means may be used to feed the gas-phase catalyst into reaction vessel pipe 14. To present a specific example in such a case, when iron(II) chloride, anhydrous, as the catalyst source is disposed inside the heating region of reaction vessel pipe 14 to sublimate the iron(II) chloride, anhydrous, by heating the inside of the heating region of reaction vessel pipe 14 and simultaneously negatively pressurizing the inside, the gas-phase catalyst including a vapor of the iron(II) chloride is allowed to exist in reaction vessel pipe 14.

Pressure of the atmosphere in reaction vessel pipe 14 in the first step, specifically, in the growth region in which substrate 28 is disposed is not particularly limited. The pressure may be the atmospheric pressure (about $1.0 \times 10^5$ Pa) or a negative or positive pressure. When the inside of reaction vessel pipe 14 is adjusted to a negative pressure atmosphere in the second step, the atmosphere is preferably adjusted to the negative pressure also in the first step to shorten transition time between the steps. In a case where the inside of reaction vessel pipe 14 is adjusted to the negative pressure atmosphere in the first step, the specific total pressure in the atmosphere is not particularly limited. Specific examples include adjustment to $10^{-2}$ Pa or more and $10^4$ Pa or less.

When first gas-phase material feed device 31 is used to feed the gas-phase catalyst, the temperature in the atmosphere in reaction vessel pipe 14 in the first step is not particularly limited. The temperature may be ordinary temperature (about 25° C.), and the atmosphere may be heated or cooled.

As will be described later, the growth region in reaction vessel pipe 14 is preferably heated in the second step, and therefore the growth region may preferably be heated also in the first step to shorten the transition time between the steps.

In addition to the above method, iron(II) chloride, anhydrous, may be used as the feed source for the gas-phase catalyst, this iron(II) chloride, anhydrous, may be heated to sublimate the iron(II) chloride, and a generated vapor of the iron(II) chloride may be introduced into reaction vessel pipe 14 in which substrate 28 is disposed. The sublimation temperature of iron(II) chloride is about 950 K in the atmospheric pressure (about $1.0 \times 10^5$ Pa), but can be decreased by adjusting the atmosphere inside the heating region of reaction vessel pipe 14 to a negative pressure.

(2) Second Step

In the second step, the catalyst generated based on the gas-phase catalyst existing in the first chamber is used to form CNT from the carbon source contained in the raw material gas fed into the first chamber. Specifically, at least one kind of gas-phase catalyst, which is formed from the iron family element-containing substance and halogen-containing substance, is used as a catalyst precursor to generate a catalyst on substrate 28, and the catalyst is used to form CNT from the carbon source.

Kinds of the raw material gas are not particularly limited, but ordinarily, a hydrocarbon-based material is used and specific examples include acetylene. The method for allowing the raw material gas to exist in reaction vessel pipe 14 (particularly in the growth region) is not particularly limited. As in production apparatuses 10, 50 and 60 described above, the raw material gas may be allowed to exist by feeding the raw material gas from raw material gas feed device 30, or a material that can generate the raw material gas may be allowed to previously exist inside reaction vessel pipe 14 to generate the raw material gas from the material and to diffuse the raw material gas in reaction vessel pipe 14, and thus the second step may be started. When the raw material gas is fed from raw material gas feed device 30, the flow rate of feeding the raw material gas into reaction vessel pipe 14 is preferably controlled using a flow rate adjusting instrument. The flow rate of feed is ordinarily expressed in terms of a unit of sccm and 1 sccm means a flow rate of 1 mL per minute for gas converted under an environment of 273 K and $1.01 \times 10^5$ Pa. In the case of the production apparatuses 10, 50 and 60 having the configurations as shown in FIGS. 1, 3 and 4, the flow rate of gas to be fed into reaction vessel pipe 14 is set up based on an inside diameter of reaction vessel pipe 14, pressure measured using pressure gauge 13, and the like. Specific examples of a preferred flow rate of feeding an acetylene-containing raw material gas when the pressure by pressure gauge 13 is within $1 \times 10^2$ Pa or more and $1 \times 10^3$ Pa or less include 10 sccm or more and 1,000 sccm or less, and in this case, the flow rate thereof is further preferably adjusted to 20 sccm or more and 500 sccm or less, and particularly preferably, to 50 sccm or more and 300 sccm or less.

As used herein, the "gas-phase co-catalyst" means a gas-phase component having a function (hereinafter, also referred to as a "growth promotion function") for enhancing the growth rate of a CNT array to be produced by the gas-phase catalysis process described above, and in a preferred embodiment, a gas-phase component having a function (hereinafter, also referred to as a "function for improving spinning properties") for further improving the spinning properties of the CNT array produced. Detail of the growth promotion function is not particularly limited. Specific components of the gas-phase co-catalyst are not particularly limited as long as the components fulfill the growth promotion function described above, and preferably, also the function for improving spinning properties, and specific examples include acetone.

The method for allowing the gas-phase co-catalyst to exist in reaction vessel pipe 14 (particularly in the growth region) in the second step is not particularly limited. As in production apparatuses 10, 50 and 60 described above, the gas-phase co-catalyst may be allowed to exist by feeding the gas-phase co-catalyst from gas-phase co-catalyst feed device 32. When the gas-phase co-catalyst is fed from gas-phase co-catalyst feed device 32, the flow rate of feeding the gas-phase co-catalyst into reaction vessel pipe 14 is preferably controlled using the flow rate adjusting instrument. In an alternative embodiment, a material that can generate the gas-phase co-catalyst may be allowed to previously exist inside reaction vessel pipe 14 to generate the gas-phase co-catalyst from the material by means of heating, pressure reduction or the like and to diffuse the gas-phase co-catalyst in reaction vessel pipe 14.

The total pressure in the atmosphere inside reaction vessel pipe 14 in the second step is not particularly limited. The total pressure may be the atmospheric pressure (about $1.0 \times 10^5$ Pa) or a negative or positive pressure. The total pressure may be appropriately set up in consideration of a composition (partial pressure ratio) of substances existing in reaction vessel pipe 14, or the like. To show specific examples of a pressure range when the atmosphere inside the heating region in reaction vessel pipe 14 is adjusted to a negative pressure, the pressure range is adjusted to $1\times10^1$ Pa or more and $1\times10^4$ Pa or less, preferably, $2\times10^1$ Pa or more and $5\times10^3$ Pa or less, further preferably, $5\times10^1$ Pa or more and $2\times10^3$ Pa or less, and particularly preferably, $1\times10^2$ Pa or more and $1\times10^3$ Pa or less.

Temperature of the growth region in reaction vessel pipe 14 in the second step is not particularly limited as long as a CNT array can be formed on the base surface of substrate 28 using the raw material gas under the condition in which an appropriate amount of the gas-phase catalyst and the gas-phase co-catalyst, which is used as necessary, exists in the growth region. As described above, setting a lowered temperature on the base surface of substrate 28 in the first step may contribute to the formation of the catalyst on the base surface, in which case the temperature of the growth region in reaction vessel pipe 14 in the second step may be changed to be higher than that in the first step.

Temperature of the base surface in the second step may be controlled by adjusting the temperature of the growth region in reaction vessel pipe 14. Temperature of the base surface of substrate 28 in the second step is preferably heated to $8\times10^2$ K or higher. When the temperature of the base surface of substrate 28 is $8\times10^2$ K or higher, interaction between the gas-phase catalyst and gas-phase co-catalyst, which is used as necessary, and the raw material gas is easily caused on the base surface to facilitate the growth of a CNT array on the base surface of substrate 28. From a viewpoint of easily causing this interaction, the temperature of the base surface in the second step is preferably heated to $9\times10^2$ K or higher, more preferably $1.0\times10^3$ K or higher, and particularly preferably $1.1\times10^3$ K or higher. The upper limit of the temperature of the base surface of substrate 28 in the second step is not particularly limited, but when the temperature is excessively high, the material constituting the base surface and/or the material constituting the substrate (these materials may be or may not be identical) may occasionally lack in stability as solid, and therefore the upper limit is preferably set up in consideration of the melting point and sublimation temperature of these materials. When the load of the reaction vessel pipe is taken into consideration, the upper limit of the temperature of substrate 28 is preferably adjusted to about $1.5\times10^3$ K.

3. CNT Array

Figure 5:
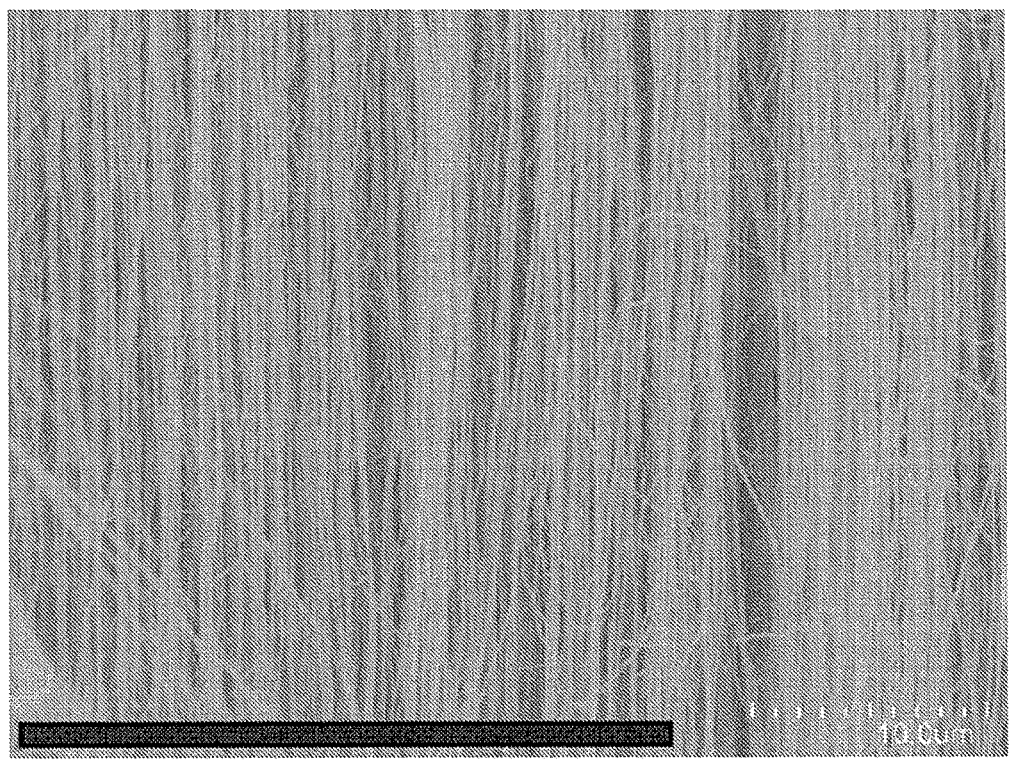
FIG. 5 is an image showing CNT that constitute a CNT array.
Figure 6:
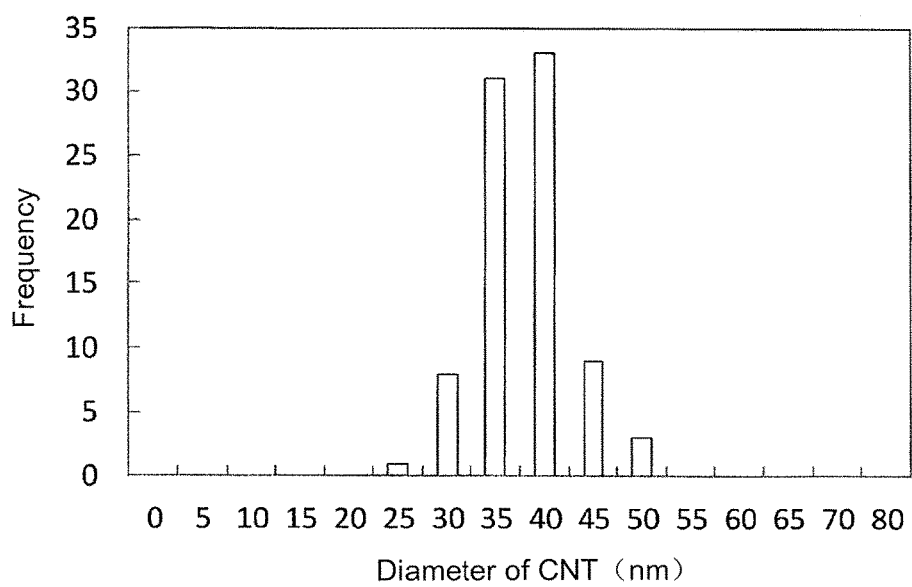
FIG. 6 is a graph showing an outer diameter distribution of CNT that constitute a CNT array.

As one example of a CNT array produced by the production method according to the present embodiment, as shown in FIG. 5, the CNT array has a part having a configuration in which a plurality of CNT are disposed so as to be oriented in a certain direction. When diameters of the plurality of CNT in the part are measured to determine a distribution thereof, as shown in FIG. 6, most of the diameters of the CNT are within a range of 20 to 50 nanometers. Diameters of CNT can be measured from an observed image obtained when observing CNT that constitute a CNT array, such as using an electron microscope.

Figure 7:
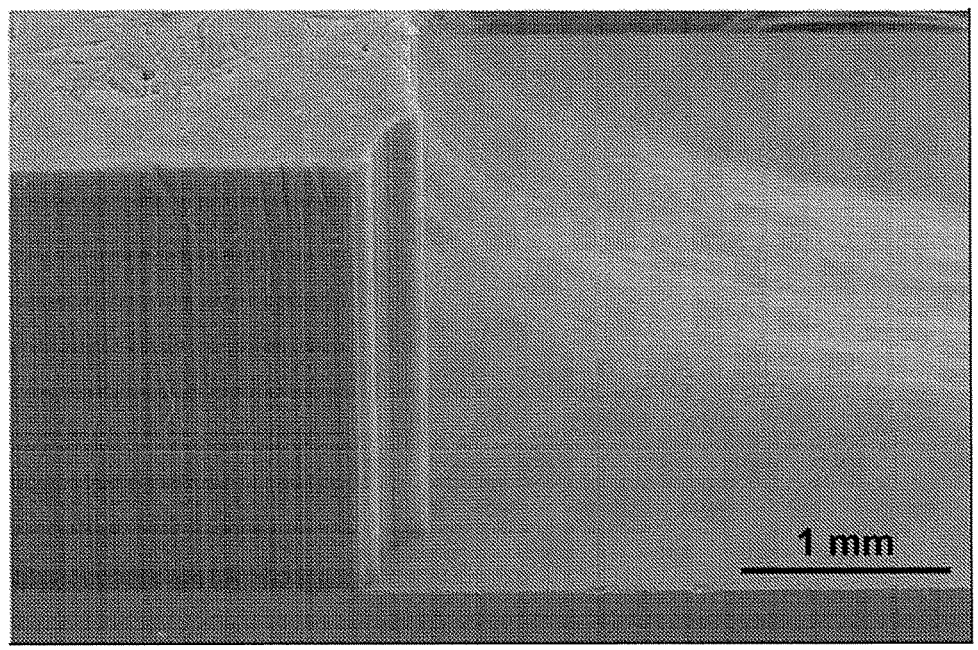
FIG. 7 is an image showing a state in which a CNT entangled body is produced by spinning a CNT array.
Figure 8:
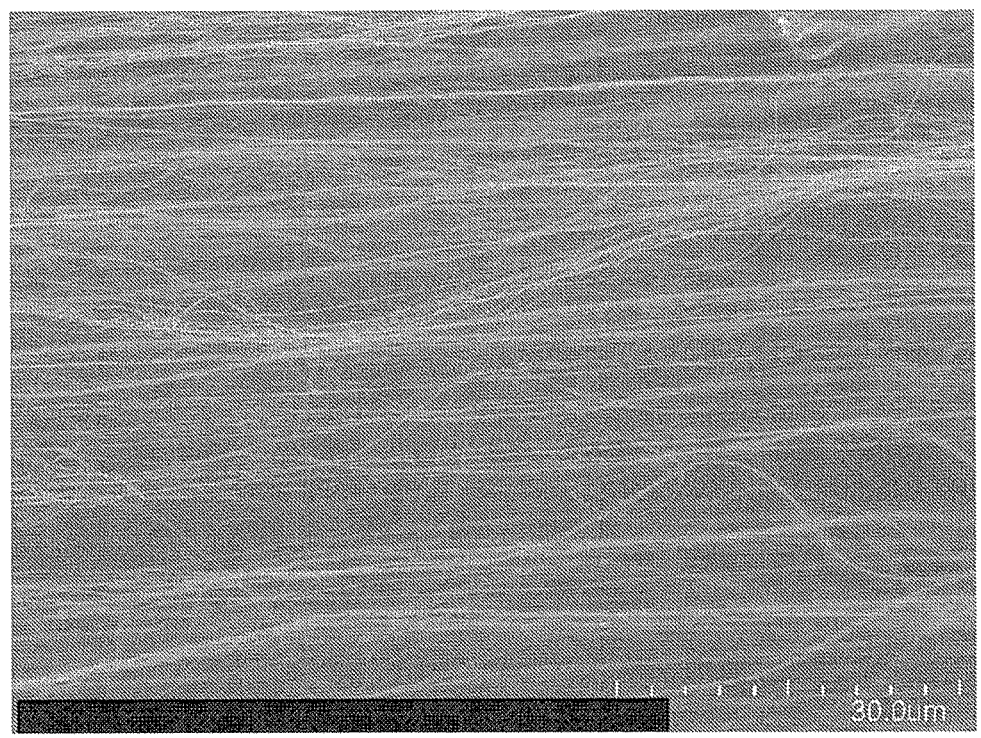
FIG. 8 is an enlarged image of part of a CNT entangled body obtained from a CNT array.

The CNT array produced by the production method according to the present embodiment can have the spinning properties. Specifically, the CNT constituting the CNT array are taken and drawn (spun) in a direction in which the CNT are separated from the CNT array, and thus a structure (CNT entangled body) having the plurality of CNT entangled to each other can be obtained. FIG. 7 is an image showing a state in which the CNT entangled body is formed from the CNT array, and FIG. 8 is an image in which part of the CNT entangled body is enlarged. As shown in FIG. 7, the CNT constituting the CNT array is continuously drawn, and thus the CNT entangled body is formed. Moreover, as shown in FIG. 8, the CNT constituting the CNT entangled body is entangled to each other while being oriented in a direction (spinning direction) in which the CNT is drawn from the CNT array to form a connected body. A member having the CNT array and allowing formation of the CNT entangled body herein is also referred to as a "spinning source member."

4. CNT Entangled Body

The CNT entangled body obtained from the spinning source member can have various shapes. Specific one example may be a linear shape, and specific another example may be a web shape. The linearly-shaped CNT entangled body can be handled in a manner equivalent to that for fibers if twist is added when the spinning source member is drawn to obtain the linearly-shaped CNT entangled body, and used also as electrical wiring. On the other hand, the web-shaped CNT entangled body can be directly handled in a manner similar to that for a nonwoven fabric.

The length of the CNT entangled body in the spinning direction is not particularly limited, and needs to be appropriately set up according to an intended use. In general, the spinning length of 2 millimeters or more allows application of the CNT entangled body to a part level such as a contact part and an electrode. Moreover, in the linearly-shaped CNT entangled body, the degree of orientation of the CNT constituting the body can be arbitrarily controlled by changing a spinning method from the spinning source member (examples thereof include varying the degree of twist). Accordingly, the CNT entangled body in which the mechanical characteristics or the electrical characteristics are different can be produced by changing the spinning method from the spinning source member.

If the degree of entanglement is decreased, the CNT entangled body becomes fine in the case of the linear shape, and thin in the case of the web shape. If the degree progresses, the CNT entangled body becomes difficult to visually observe, and the CNT entangled body on the occasion can be used as transparent fibers, transparent wiring, or a transparent web (transparent sheet-shaped member).

The CNT entangled body may consist only of CNT or may also be a composite structure with any other material. As described above, the CNT entangled body has the configuration formed of the plurality of CNT being entangled to each other, and therefore a void exists among the plurality of entangled CNT in a manner similar to that for a plurality of fibers constituting a nonwoven fabric. The composite structure can be easily formed by introducing powder (specific examples include metal fine particles, inorganic particles such as particles of silica, and organic particles such as particles of an ethylene-based polymer) into the void portion thereof or impregnation with a liquid thereinto.

Moreover, the surface of the CNT constituting the CNT entangled body may be modified. The outside surface of CNT is constituted of graphene, and therefore the CNT entangled body is hydrophobic as is, but hydrophilic treatment is applied to the surface of the CNT constituting the CNT entangled body, and thus the CNT entangled body can be made hydrophilic. Specific one example of such a hydrophilization means may be plating treatment. In the above case, the CNT entangled body obtained is formed into the composite structure between the CNT and a plated metal.

5. Production Apparatus and Production Method for CNT Having Shape Other than Array Shape CNT having a shape other than an array shape can be produced using any of production apparatuses 10, 50 and 60 for a CNT array described above. For example, there can be formed an aggregate of curved CNT without anisotropy, i.e. CNT having a secondary structure that can function as a three-dimensional mesh as a result, in a state in which ends of each of CNT are fixed on substrate 28 (such an aggregate of CNT will be referred to as a "CNT mesh" herein). The CNT mesh can be produced by adjusting production conditions in a similar method to the production method for a CNT array, i.e. a method of performing the first step (feed of the gas-phase catalyst) and the second step (feed of the carbon source) using any of production apparatuses 10, 50 and 60 for a CNT array described above. The CNT mesh can be used as a member having such a function as that of bump of flip chip.

CNT can also be produced as a generated substance by a gas-phase flow reaction. Specifically, if the first step (feed of the gas-phase catalyst) and the second step (feed of the carbon source) are carried out in a state in which a substrate is not disposed in the growth region where substrate 28 would be disposed when producing a CNT array, chemical interaction can be caused between the gas-phase catalyst existing in the growth region and the raw material gas containing the carbon source to form CNT in the growth region as a generated substance by a gas-phase flow reaction. During this operation, it is not easy for CNT grown in the growth region to grow to come close to one another to such an extent that the CNT have an array shape, so that CNT having low anisotropy in shape can be obtained.

In view of more stably obtaining CNT as a generated substance by a gas-phase flow reaction, the raw material gas may be fed prior to feeding the gas-phase catalyst. That is, if the raw material gas containing the carbon source is fed into reaction vessel pipe 14 to allow the carbon source to exist in reaction vessel pipe 14, and in this state the gas-phase catalyst is fed via first liquid L into reaction vessel pipe 14, the gas-phase catalyst fed into reaction vessel pipe 14 can immediately interact with the carbon source to form CNT. In this case, the entire region in which the raw material gas exists in reaction vessel pipe 14 can be the growth region. Moreover, the growth region can include a region to which the gas-phase catalyst is fed in reaction vessel pipe 14. In view of more stably obtaining CNT as a generated substance by a gas-phase flow reaction, predetermined direction A of reaction vessel pipe 14 may be the downward direction in the vertical direction.

The embodiments described above are set forth in order to facilitate understanding of the present invention, and not to limit the present invention. Therefore, each of the elements disclosed in the embodiments described above also includes all design modifications and equivalents belonging to the technical scope of the present invention.

EXAMPLES

The present invention will be further specifically described by way of Examples and the like below, but the scope of the present invention is not limited to the Examples and the like.

Example 1

(1) Preparation of First Liquid

A methanol solution of chloride of an iron-methanol complex was obtained as a first liquid by dissolving 500 mg of iron powder into a mixture of 3.0 mL of methanol (aqueous) and 1.0 mL of hydrochloric acid aqueous solution (concentration: 35%).

(2) Production of CNT Array

A CNT array was produced using a production apparatus for a CNT array having the configuration shown in FIG. 3. A heat-resistant tray in which the above first liquid was accommodated was placed on the inside surface of a reaction vessel pipe as the first chamber.

As the substrate, a quartz plate (20 mm×5 mm×1 mm in thickness) was prepared. Accordingly, in the present Example, all of the material constituting the base surface and the material constituting the substrate were quartz. The substrate was disposed in a portion located at the downstream side from the heat-resistant tray in the reaction vessel pipe, in a state where the quartz plate was placed on a quartz boat.

Inside of the reaction vessel pipe was evacuated to $1 \times 10^{-1}$ Pa or less using an evacuating device. Subsequently, the inside of the reaction vessel pipe was heated to $1.1 \times 10^3$ K using a heater so that the temperature of the heat-resistant tray and quartz plate would be about $1.1 \times 10^3$ K. The pressure in the tube was maintained at about 400 Pa because the pressure in the reaction vessel pipe increased due to the heating.

In a state in which the temperature in the reaction vessel pipe was $1.1 \times 10^3$ K, the second step was carried out by feeding acetylene as the raw material gas from the raw material gas feed device at an amount to be a flow rate of 190 sccm, and acetone as the gas-phase co-catalyst from the gas-phase co-catalyst feed device at an amount to be a flow rate of 10 sccm, into the reaction vessel pipe for 10 minutes. The pressure in the tube was maintained at about 400 Pa during the second step.

Figure 9:
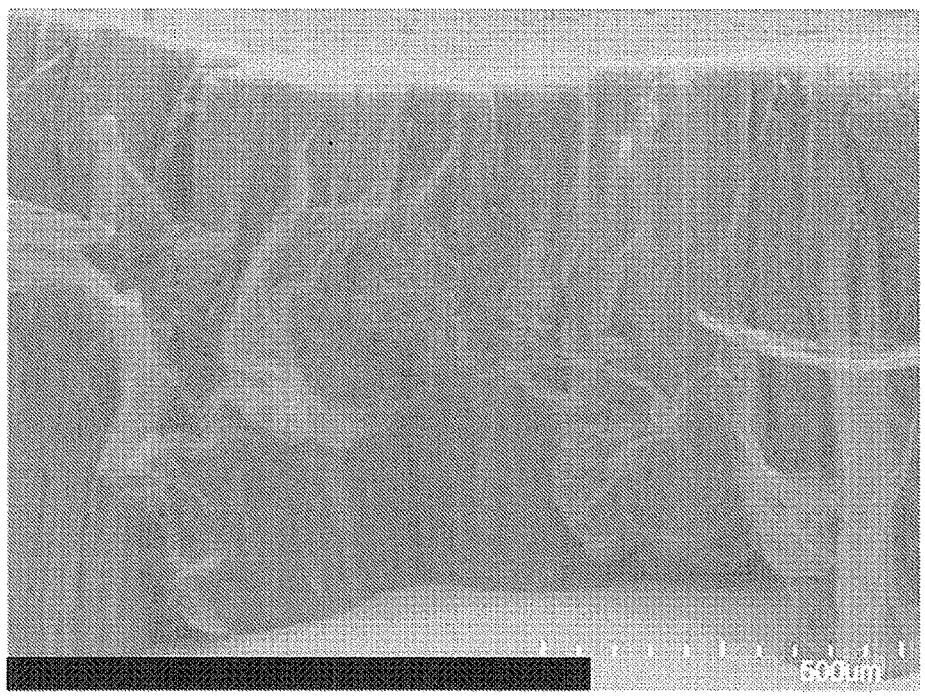
FIG. 9 is an image when observing a CNT array produced by a production method according to Example 1.

As a result, a CNT array (growth height: 700 μm) was obtained on the quartz plate as shown in FIG. 9.

Example 2

A methanol solution of iron chloride was obtained as a first liquid by dissolving 200 mg of iron(II) chloride, anhydrous, into 10 mL of methanol (anhydrous).

Thereafter, the first and second steps were carried out by performing the same operation as in Example 1.

Figure 10:
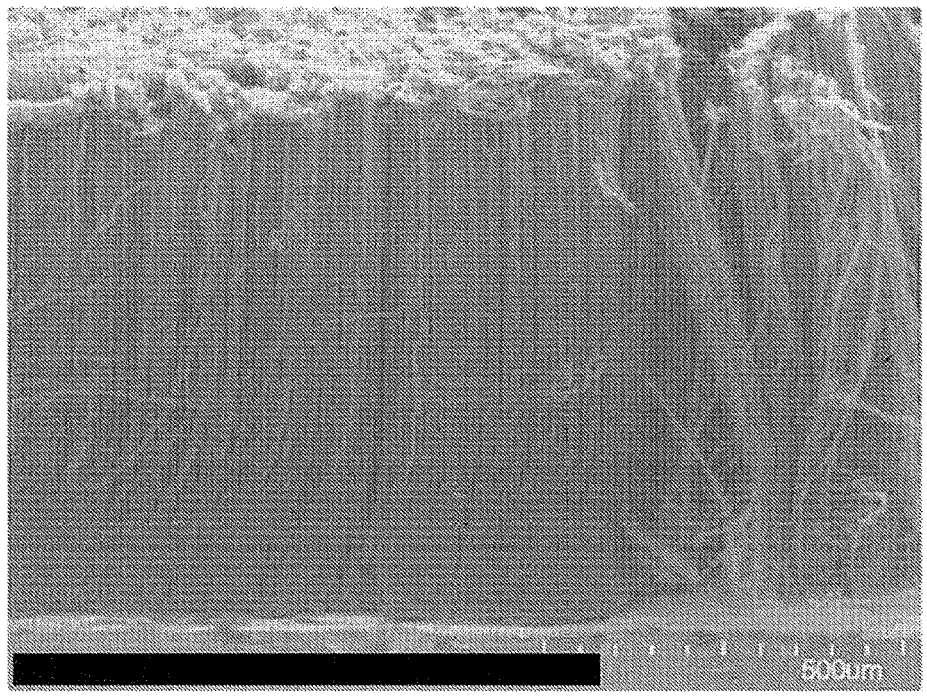
FIG. 10 is an image when observing a CNT array produced by a production method according to Example 2.

As a result, a CNT array was obtained on the quartz plate as shown in FIG. 10.

INDUSTRIAL APPLICABILITY

The CNT entangled body obtained from the CNT array produced by the production method for CNT according to the present invention is suitably used as electrical wiring, a heater, a strain sensor, and a transparent electrode sheet, for example. The CNT mesh and CNT without a specific secondary structure produced by the production method for CNT according to the present invention are suitably used as an electrode material for a secondary cell.

The invention claimed is:

1. A production method for carbon nanotubes, comprising:
    a first step of forming, from reaction of an iron family element-containing substance and a halogen-containing substance that are contained in a first liquid, at least one kind of gas-phase catalyst precursor including a halide of an iron family element, and feeding the at least one kind of gas-phase catalyst precursor into a first chamber; and a second step of forming the carbon nanotubes from a carbon source fed into the first chamber using a catalyst generated based on the gas-phase catalyst precursor existing in the first chamber, wherein the first step includes vaporization of the first liquid, and the first liquid does not contain the carbon source.

2. The production method according to claim 1, wherein:

the first step includes allowing a substrate disposed in the first chamber to exist in an atmosphere including the gas-phase catalyst precursor; and the second step includes forming the carbon nanotubes in an array-like form on a base surface of the substrate.

3. The production method according to claim 2, wherein the carbon source is fed into the first chamber in a state in which the gas-phase catalyst precursor exists in the first chamber via the first step.

4. The production method according to claim 1, wherein a temperature of the substrate in the first step is lower than a temperature of the substrate in the second step.

5. The production method according to claim 1, wherein the carbon nanotubes are formed as a generated substance by a gas-phase flow reaction.

6. The production method according to claim 1, wherein an iron family element contained in the iron family element-containing substance includes iron.

7. The production method according to claim 1, wherein the vaporization of the first liquid is performed outside the first chamber, and a vapor of the first liquid is fed into the first chamber from outside of the first chamber.

8. The production method according to claim 1, wherein the iron family element-containing substance contained in the first liquid includes an iron-methanol complex.

* * * * *